United States Patent
Peng et al.

(10) Patent No.: US 12,224,752 B1
(45) Date of Patent: Feb. 11, 2025

(54) CLOCK GATING CIRCUIT FOR DUAL-EDGE-TRIGGERED FLIP-FLOPS

(71) Applicant: QUALCOMM Incorporated, San Diego, CA (US)

(72) Inventors: Yimai Peng, Cary, NC (US); Robert Joseph Vachon, Zebulon, NC (US); Daniel Yingling, Apex, NC (US); Keith Alan Bowman, Morrisville, NC (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 18/354,374

(22) Filed: Jul. 18, 2023

(51) Int. Cl.
 *G06F 1/04* (2006.01)
 *H03K 3/037* (2006.01)
 *H03K 17/00* (2006.01)
 *H03K 19/21* (2006.01)

(52) U.S. Cl.
 CPC ............ *H03K 3/0372* (2013.01); *G06F 1/04* (2013.01); *H03K 17/005* (2013.01); *H03K 19/21* (2013.01)

(58) Field of Classification Search
 CPC .......... H03K 3/02; H03K 3/027; H03K 3/037; H03K 3/0372; H03K 17/002; H03K 17/005; H03K 19/173; H03K 19/20; H03K 19/21; G06F 1/04; G06F 1/06; G06F 1/08; G06F 1/10
 See application file for complete search history.

(56) References Cited

U.S. PATENT DOCUMENTS

| 6,137,331 | A | 10/2000 | Peset Llopis |
| 8,384,437 | B2 * | 2/2013 | Sofer ................. H03K 19/0016 326/94 |
| 2008/0054977 | A1 | 3/2008 | Matsumoto |

OTHER PUBLICATIONS

Boda R., et al., "Multiplexer-Based Design of Adders/Subtractors and Logic Gates for Low Power VLSI Applications", IOSR Journal of VLSI and Signal Processing (IOSR-JVSP), vol. 5, Issue 6, Ver. II, Dec. 1, 2015, pp. 59-66, XP093207869, Section 7, figure 7.
Hatefinasab S., et al., "Low-Cost Soft Error Robust Hardened D-Latch for CMOS Technology Circuit", Electronics, vol. 10, No. 11, Basel, Switzerland, May 25, 2021, pp. 1-19, XP093207874, Section 2, figure 1.
International Search Report and Written Opinion—PCT/US2024/033576—ISA/EPO—Oct. 24, 2024.

* cited by examiner

*Primary Examiner* — Long Nguyen
(74) *Attorney, Agent, or Firm* — Loza & Loza, LLP

(57) ABSTRACT

An apparatus, including: a clock gating circuit (CGC), including: a clock gating device configured to selectively gate/pass a selected clock signal based on an enable signal to generate an output clock signal; and a clock selection circuit configured to select a non-complementary clock signal or a complementary clock signal to generate the selected clock signal based on the output clock signal and the non-complementary clock signal or the complementary clock signal.

22 Claims, 6 Drawing Sheets

CLOCK GATING CIRCUIT FOR DUAL-EDGE-TRIGGERED FLIP-FLOPS

FIELD

Aspects of the present disclosure relate generally to data processing circuits, and in particular, to a clock gating circuit (CGC) for dual-edge-triggered (DET) flip-flops (FFs).

BACKGROUND

Functional circuits, such as processors, memory, and others, typically include sequential circuits, such as a network of cascaded and parallel flip-flops, driven by clock signals to move data from inputs, to functional subsystems or cores, and to outputs. Generally, clock generators, such as phase locked loops (PLLs), are employed to generate such clock signals. As functional circuits consume significant power while being driven by clock signals, often clock gating circuits (CGCs) are provided to gate the clock signals when the functional circuits are not actively processing data, and pass the clock signals when the functional circuit are actively processing data.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus. The apparatus includes a clock gating circuit (CGC), including: a clock gating device configured to selectively gate/pass a selected clock signal based on an enable signal to generate an output clock signal; and a clock selection circuit configured to select a non-complementary clock signal or a complementary clock signal to generate the selected clock signal based on the output clock signal and the non-complementary clock signal or the complementary clock signal.

Another aspect of the disclosure relates to an apparatus. The apparatus includes: a clock gating circuit (CGC), comprising: a multiplexer including a first input configured to receive a non-complementary clock signal and a second input configured to receive a complementary clock signal; a clock gating device including a first input coupled to an output of the multiplexer and a second input configured to receive an enable signal; and a clock selection circuit including a first input coupled to an output of the clock gating device, a second input configured to receive the non-complementary or complementary clock signal, a third input configured to receive the enable signal, and an output coupled to a selection input of the multiplexer.

Another aspect of the disclosure relates to a method. The method includes generating a logic level difference signal based on a comparison of a logic level of an output clock signal with a logic level of a non-complementary clock signal; selecting the non-complementary clock signal or a complementary clock signal based on the logic level difference signal and an asserted enable signal; and outputting the selected one of the non-complementary clock signal or the complementary clock signal as the output clock signal in response to the asserted enable signal.

Another aspect of the disclosure relates to an apparatus. The apparatus includes means for generating a logic level difference signal based on a comparison of a logic level of an output clock signal with a logic level of a non-complementary clock signal; means for selecting the non-complementary clock signal or a complementary clock signal based on the logic level difference signal and an asserted enable signal; and means for outputting the selected one of the non-complementary clock signal or the complementary clock signal as the output clock signal in response to the asserted enable signal.

Another aspect of the disclosure relates to a wireless communication device. The wireless communication device includes: at least one antenna; a transceiver coupled to the at least one antenna; one or more signal processing cores coupled to the transceiver, wherein the one or more signal processing cores comprises one or more clock gating circuits each comprising: a clock gating circuit configured to selectively gate/pass a selected clock signal based on an enable signal to generate an output clock signal; and a clock selection circuit configured to select a non-complementary clock signal or a complementary clock to generate the selected clock signal based on the output clock signal and the non-complementary clock signal or the complementary clock signal.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
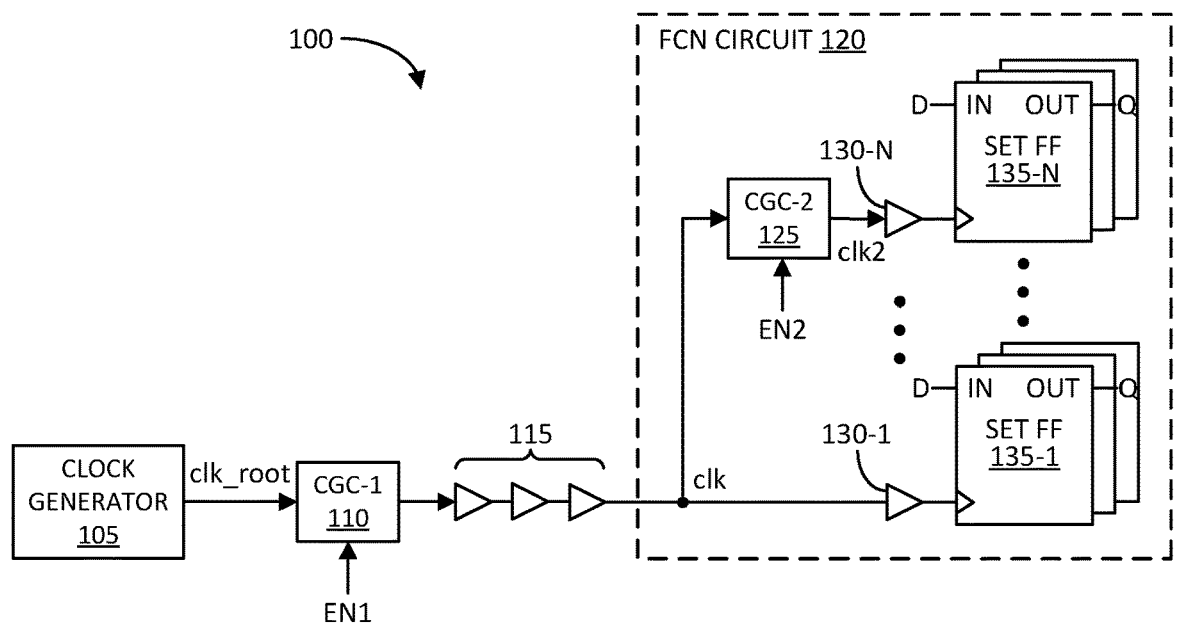
FIG. 1 illustrates a block diagram of an example data processing circuit in accordance with an aspect of the disclosure.

FIG. 1 illustrates a block diagram of an example data processing circuit 100 in accordance with an aspect of the disclosure. The data processing circuit 100 may be implemented in an integrated circuit (IC), such as a system on chip (SOC). It shall be understood that the data processing circuit 100 is merely an example, and many variations with same and/or different components are contemplated.

In particular, the data processing circuit 100 includes a clock generator (e.g., phase locked loop (PLL)) 105, a first (e.g., hierarchical level) clock gating circuit (CGC-1) 110, a set of one or more cascaded buffers 115, and a functional circuit 120 (e.g., a processor, a central processing unit (CPU), a graphics processing unit (GPU), a digital signal processor (DSP), a memory (e.g., dynamic random access memory (DRAM)), etc.). The functional circuit 120, in turn, includes a second (e.g., hierarchical level) clock gating circuit (CGC-2) 125, a set of input buffers 130-1 to 130-N, and a set of single-edge-triggered (SET) flip-flops (FFs) 135-1 to 135-N.

The clock generator 105 is configured to generate a root clock signal clk_root. A clock signal, as defined herein, is a substantially periodic voltage waveform (e.g., substantially square wave) used to sequentially control the movement of data within a functional circuit, such as the functional circuit 120. The first clock gating circuit (CGC-1) 110 is configured to gate/pass the root clock signal clk_root based on a first enable signal (EN1). For example, if the first enable signal (EN1) is asserted (e.g., a logic one (1) or high voltage level), the first clock gating circuit (CGC-1) 110 allows the root clock signal clk_root to pass therethrough as an output clock signal clk. If the first enable signal (EN1) is not asserted (e.g., a logic zero (0) or low voltage level), the first clock gating circuit (CGC-1) 110 gates the root clock signal clk_root from passing therethrough.

The set of one or more cascaded buffers 115 provides some isolation between the first clock gating circuit (CGC-1) 110 and the functional circuit 120 to maintain the integrity of the output clock signal clk. The output clock signal clk may be provided to clock inputs of the set of SET FFs 135-1 to 135-N−1 via the set of input buffers 130-1 to 130-N−1, respectively. In this example, the second clock gating circuit (CGC-2) 125 is configured to gate/pass the output clock signal clk based on a second enable signal (EN2) in a similar manner as the first clock gating circuit (CGC-1) 110 (e.g., pass if EN2=1, and gate if EN2=0). The second gated output clock signal clk2 is provided to the clock input of the SET FF 135-N via the input buffer 130-N. Each of the set of SET FFs 135-1 to 135-N, which may include parallel SET FFs or a network of SET FFs, may pertain to a set of data pipelines for moving/routing input data (D) and output data (Q) to and/or from functional blocks (e.g., combinational logic, arithmetic logic units (ALUs), registers, etc.) as part of the functional circuit 120.

As discussed, in this example, the data processing circuit 100 uses SET FFs that capture or move data on one of the edges or transitions (e.g., rising or falling transition) per period of the clock signal clk. The other edge or transition (e.g., falling or rising transition) of the clock period merely sets up the SET FF for the next capture interval. Accordingly, from a power efficient perspective, the data processing circuit 100 may not be optimal as one of the edges per clock period may be considered wasted energy as it does not effectuate data propagation or movement. This is explained further herein with reference to more detail descriptions of a SET FF.

Figure 2:
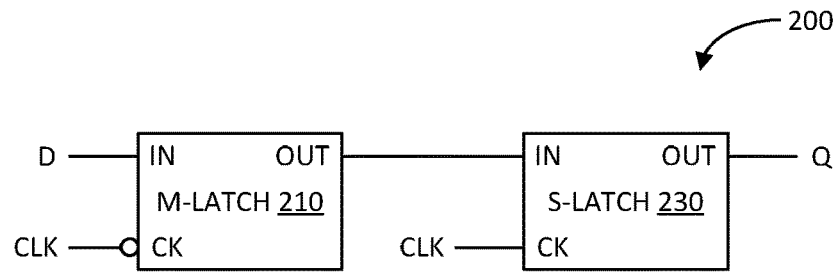
FIG. 2 illustrates a block diagram of an example single-edge-triggered (SET) flip-flop (FF) in accordance with another aspect of the disclosure.

FIG. 2 illustrates a block diagram of an example single-edge-triggered (SET) flip-flop (FF) 200 in accordance with another aspect of the disclosure. The SET FF 200 may be an example detailed implementation of any of the set of SET FFs 135-1 to 135-N of data processing circuit 100.

In particular, the SET FF 200 includes a master latch (M-latch) 210 cascaded with a slave latch (S-latch) 230 along a data path. The master latch 210 includes a data input (IN) configured to receive a data (D) signal, a complementary (e.g., inverting) clock input (CK) configured to receive a clock signal CLK, and a data output (OUT). Similarly, the slave latch 230 includes a data input (IN) coupled to the data output (OUT) of the master latch 210, a non-complementary clock input (CK) configured to receive the clock signal CLK, and a data output (OUT) configured to generate an output data signal (Q).

In operation, when the clock signal CLK is a logic zero (0) or low, the master latch 210 is transparent and the slave latch 230 is opaque. The master latch 210 being transparent accepts the current data D(t) at its data input (IN) and provides it to its data output (OUT). The slave latch 230 being opaque latches the previous data D(t−1) while blocking or preventing the current data (D(t) from affecting the latched previous data D(t−1). When the clock signal CLK transitions to a logic one (1) or high, the master latch 210 becomes opaque and the slave latch 230 becomes transparent. The master latch 210 being opaque latches the current data D(t) while blocking or preventing the next data D(t+1) from affecting the latched current data D(t). The slave latch 230 being transparent receives and outputs the current data D(t) as the output data signal Q(t).

Note that two clock transitions are needed to propagate data from the data input of the master latch 210 to the data output of the slave latch 230. For instance, in this example, the falling edge or transition of the clock signal causes the master latch 210 to merely accept the current data D(t). Then, the rising edge or transition causes the current data D(t) to propagate from the master latch 210 to the slave latch 230 to output the current data Q(t). Thus, the falling edge or transition of the clock signal may be considered wasted energy as it does not effectuate data movement from the input to the output of the SET FF 200.

Figure 3:
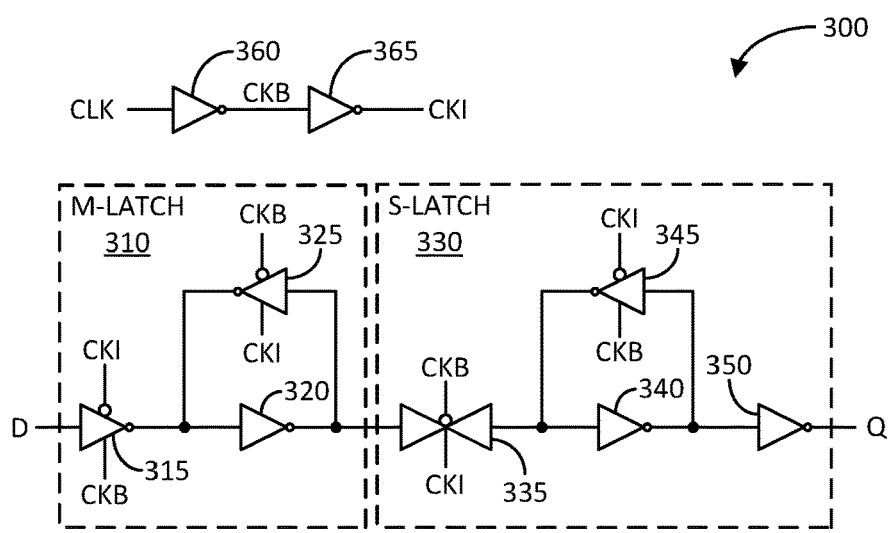
FIG. 3 illustrates a block diagram of another example single-edge-triggered (SET) flip-flop (FF) in accordance with another aspect of the disclosure.

FIG. 3 illustrates a block diagram of another example single-edge-triggered (SET) flip-flop (FF) 300 in accordance with another aspect of the disclosure. The SET FF 300 may be a more detailed implementation of the SET FF 200 previously discussed. Similarly, the SET FF 300 includes a master latch 310 cascaded with a slave latch 330 along a data path. Additionally, the SET FF 300 includes a pair of cascaded inverters 360 and 365 configured to generate a complementary clock signal (CKB) and a non-complementary clock signal (CKI) based on an input clock signal (CLK), respectively.

The master latch 310, in turn, includes a tristate inverter 315, and a latch circuit including a latch inverter 320 and a latch tristate inverter 325. The tristate inverter 315 includes a data input, which serves as the data input of the SET FF 300, to receive an input data signal D. The tristate inverter 315 further includes complementary and non-complementary control inputs configured to receive the non-complementary clock signal CKI and the complementary clock signal CKB, respectively. The tristate inverter 315 includes an output coupled to an input of the latch inverter 320 and an output of the latch tristate inverter 325. The latch inverter 320 includes an output coupled to an input of the latch tristate inverter 325. The latch tristate inverter 325 further includes complementary and non-complementary control inputs configured to receive the complementary clock signal CKB and the non-complementary clock signal CKI, respectively.

The slave latch 330, in turn, includes a transmission gate 335, a latch circuit including a latch inverter 340 and a latch tristate inverter 345, and a output inverter 350. The transmission gate 335 includes a data input coupled to an output (e.g., the output of the latch inverter 320) of the master latch 310. The transmission gate 335 further includes complementary and non-complementary control inputs configured to receive the complementary clock signal CKB and the non-complementary clock signal CKI, respectively. The transmission gate 335 includes an output coupled to an input of the latch inverter 340 and an output of the latch tristate inverter 345. The latch inverter 340 includes an output coupled to respective inputs of the latch tristate inverter 345 and the output inverter 350. The latch tristate inverter 345 further includes complementary and non-complementary control inputs configured to receive the non-complementary clock signal CKI and the complementary clock signal CKB, respectively. The output inverter 350 includes an output configured to generate an output data signal (Q).

In operation, when the input clock signal CLK transitions to a logic zero (0), the inverter 360 generates the complementary clock signal CKB as a logic one (1), and the inverter 365 generates the non-complementary clock signal CKI as a logic zero (0). Based on such states of the clock signals CKI and CKB, the master latch 310 is transparent and the slave latch 330 is opaque. That is, with regard to the master latch 310, the tristate inverter 315 is enabled to receive the current data D(t), and the cascaded inverters 315 and 320 reproduces the current data D(t) at the input of the slave latch 330, while the latch tristate inverter 325 is disabled. With regard to the slave latch 330, the transmission gate 335 is gated to prevent the current data D(t) from affecting the latched inverted previous data $\overline{D}(t-1)$ held by the latch inverter 340 and enabled latch tristate inverter 345. The output inverter 350 inverts the latched inverted previous data $\overline{D}(t-1)$ to generate the previous output data Q(t−1).

When the input clock signal CLK transitions to a logic one (1), the inverter 360 generates the complementary clock signal CKB as a logic zero (0), and the inverter 365 generates the non-complementary clock signal CKI as a logic one (1). Based on these states of the clock signals CKI and CKB, the master latch 310 becomes opaque and the slave latch 330 becomes transparent. That is, with regard to the master latch 310, the tristate inverter 315 is disabled to block or prevent the next data D(t+1) from affecting the latched current data D(t) by the latch inverter 320 and the enabled latch tristate inverter 325. With regard to the slave latch 330, the transmission gate 335 is not gated to pass the current data D(t) from the output of the master latch 310 to the output of the slave latch 330 via inverters 340 and 350 to generate the current output data Q(t) while the latch tristate inverter 345 is disabled.

Similarly, as discussed above with SET FF 200, a rising edge or transition of the clock signal CLK causes the current data D(t) to propagate from the master latch 310 to the output of the slave latch 330, i.e., the output of the SET FF 300. The falling edge of the clock signal CLK merely prepares the SET FF 300 to accept the current data D(t) by propagating it to the master latch 310. Similarly, the falling clock edge in this example may be regarded as wasted power because it does not cause a movement of the data from the input to the output of the SET FF 300.

Figure 4A:
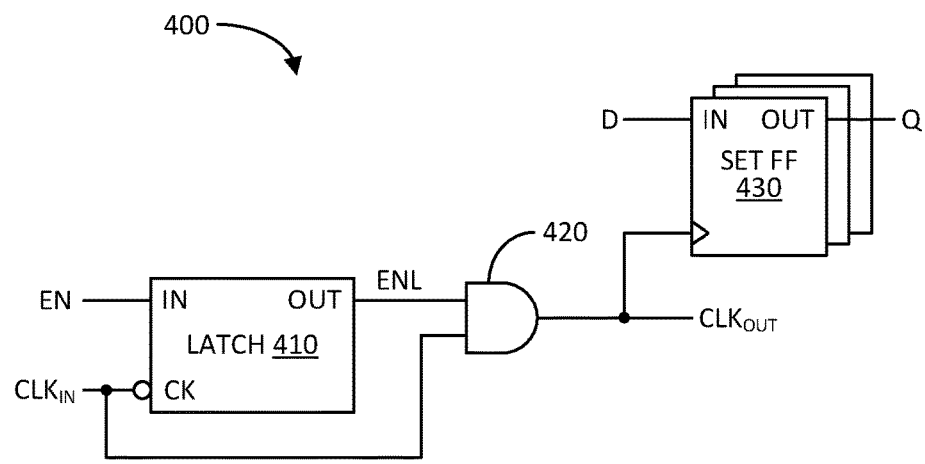
FIG. 4A illustrates a block diagram of an example clock gating circuit (CGC) for single-edge-triggered (SET) flip-flops (FFs) in accordance with another aspect of the disclosure.

FIG. 4A illustrates a block diagram of an example clock gating circuit (CGC) 400 for a set of single-edge-triggered (SET) flip-flops (FFs) 430 in accordance with another aspect of the disclosure. The CGC 400 may be an example detailed implementation of any of the CGCs 110 and 125 of data processing circuit 100. The CGC 400 includes a latch 410 and an AND gate 420. The latch 410 includes an input (IN) to receive an enable signal EN, a complementary (e.g., inverting) clock input (CK) configured to receive an input clock signal $CLK_{IN}$, and an output (OUT) configured to generate a latched enable signal ENL. The AND gate 420 includes a first input coupled the output (OUT) of the latch 410 to receive the latched enable signal ENL therefrom, and a second input configured to receive the input clock signal $CLK_{IN}$. The AND gate 420 generates an output clock signal $CLK_{OUT}$ at an output coupled to clock inputs of the set of SET FFs 430. The operation of the CGC 400 is discussed further herein with reference to FIG. 4B.

Figure 4B:
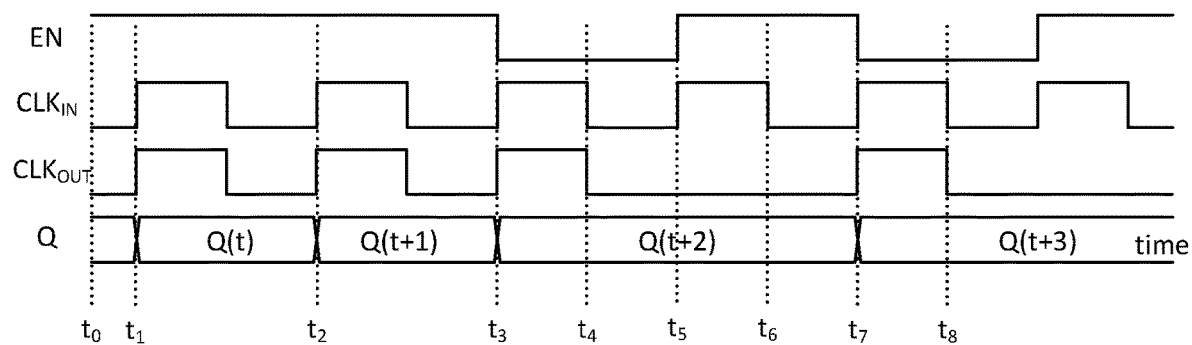
FIG. 4B illustrates a timing diagram of example signals associated with the clock gating circuit (CGC) of FIG. 4A in accordance with another aspect of the disclosure.

FIG. 4B illustrates a timing diagram of example signals associated with the CGC 400 in accordance with another aspect of the disclosure. The horizontal axis of the timing diagram represents time. From top to bottom, the vertical axis represents logic states of the enable signal EN, the input clock signal $CLK_{IN}$, the output clock signal $CLK_{OUT}$, and the output data (Q) of the set of SET FFs 430.

When the enable signal EN is asserted (e.g., a logic one (1) or high) during time interval $t_0$ to $t_3$, the latch 410 generates an asserted latched enable signal ENL (e.g., a logic one (1) or high), which causes the AND gate 420 to pass the input clock signal $CLK_{IN}$ to produce the output clock signal $CLK_{OUT}$. Accordingly, the rising edges or transitions of the output clock signal $CLK_{OUT}$ at times $t_1$, $t_2$, and $t_3$ causes the set of SET FFs 430 to output data Q(t), Q(t+1), and Q(t+2), respectively. At time $t_3$, the enable signal EN becomes deasserted (e.g., a logic zero (0) or low). In response to the following falling edge or transition of the input clock signal $CLK_{IN}$ at time $t_4$, the latch 410 deasserts the latched enable signal ENL (e.g., a logic zero (0) or low).

In response, the AND gate 420 maintains the output clock signal $CLK_{OUT}$ at a fixed logic zero (0) or low until the latched enable signal ENL becomes a logic one (1) or high at time $t_6$. During time interval $t_6$ to $t_8$, the AND gate 420 passes the input clock signal $CLK_{IN}$ to produce the output clock signal $CLK_{OUT}$. Accordingly, at time $t_7$, the output clock signal $CLK_{OUT}$ experiences a rising edge or transition. In response, the set of SET FFs 430 outputs the next data Q(t+3) at time $t_7$. Note that because the enable signal EN was deasserted between times $t_3$ and $t_5$, the output clock signal $CLK_{OUT}$ did not experience a rising edge at time $t_5$, as did the input clock signal $CLK_{IN}$. Thus, the set of SET FFs maintain its output data at Q(t+2) for two periods of the input clock signal $CLK_{IN}$.

Figure 5:
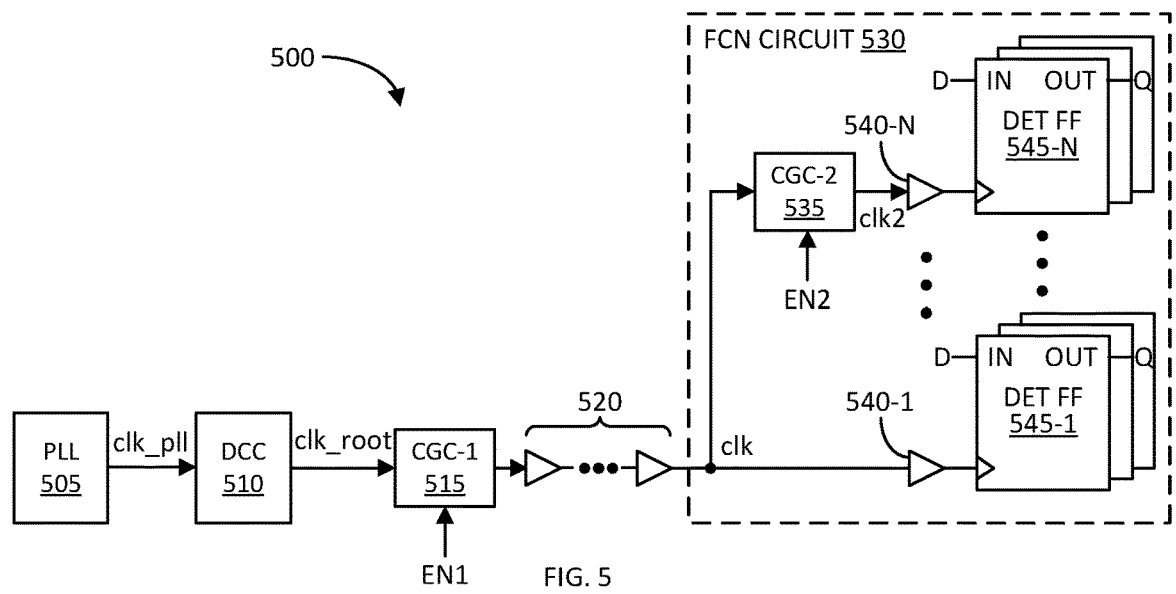
FIG. 5 illustrates a block diagram of another example data processing circuit in accordance with an aspect of the disclosure.

FIG. 5 illustrates a block diagram of another example data processing circuit 500 in accordance with another aspect of the disclosure. In contrast to data processing circuit 100, the data processing circuit 500 includes dual-edge-triggered (DET) flip-flops (FFs) that capture/propagate/move data on both edges or transitions (e.g., rising and falling) of a clock signal. Thus, the frequency of the clock signal may be halved to save power, while still maintaining the same data throughput as the SET-based data processing circuit 100. Alternatively, the frequency of the clock signal may remain the same while achieving double the data throughput as the SET-based data processing circuit 100. It shall be understood that the data processing circuit 500 is merely an example, and many variations with same and/or different components are contemplated.

In particular, the data processing circuit 500 includes a clock generator (e.g., phase locked loop (PLL)) 505, a duty cycle controller (DCC) 510, a first (e.g., hierarchical level) clock gating circuit (CGC-1) 515, a set of one or more cascaded buffers 520, and a functional circuit 530 (e.g., a processor, a central processing unit (CPU), a graphics processing unit (GPU), a digital signal processor (DSP), a memory (e.g., dynamic random access memory (DRAM)), etc.). The functional circuit 530, in turn, includes a second (e.g., hierarchical level) clock gating circuit (CGC-2) 535, a set of input buffers 540-1 to 540-N, and a set of dual-edge-triggered (DET) flip-flops (FFs) 545-1 to 545-N.

The clock generator (e.g., PLL) 505 is configured to generate a source clock signal clk_pll. The DCC 510 is configured to control/adjust the duty cycle of the source clock signal clk_pll to generate a root clock signal clk_root having substantially 50 percent (%) duty cycle. As the set of DET FFs 545-1 to 545-N move data on both the rising and falling edges of a clock signal, duty cycle distortion in the clock signal substantially affects performance of DET sequential circuits. This is because the timing of all the clock edges should comply with setup and hold time margins. Whereas, in the case of the SET FF where data propagates in response to, for example, the rising edge of a clock signal, the timing of the falling edge is not that critical. Accordingly, duty cycle distortion in the clock signal does not significantly affect the performance of SET sequential circuits.

The first clock gating circuit (CGC-1) 515 is configured to gate/pass the root clock signal clk_root based on a first enable signal (EN1). Similarly, if the first enable signal (EN1) is asserted (e.g., a logic one (1) or high voltage level), the first clock gating circuit (CGC-1) 515 allows the root clock signal clk_root to pass therethrough as an output clock signal clk. If the first enable signal (EN1) is not asserted (e.g., a logic zero (0) or low voltage level), the first clock gating circuit (CGC-1) 515 gates the root clock signal clk_root from passing therethrough.

The set of one or more cascaded buffers 520 provides some isolation between the first clock gating circuit (CGC-1) 515 and the functional circuit 530 to maintain the integrity of the output clock signal clk. The output clock signal clk may be provided to clock inputs of the set of DET FFs 545-1 to 545-N-1 via a set of input buffers 540-1 to 540-N-1, respectively. In this example, the second clock gating circuit (CGC-2) 535 is configured to gate/pass the output clock signal clk based on a second enable signal (EN2) in a similar manner as the first clock gating circuit (CGC-1) 515 (e.g., pass if EN2=1, and gate if EN2=0). The second gated output clock signal clk2 is provided to the clock input of the DET FF 545-N via the input buffer 540-N. Each of the set of DET FFs 545-1 to 545-N, which may include parallel DET FFs or a network of DET FFs, may pertain to a set of data pipelines for moving/routing input data (D) and output data (Q) to and/or from functional blocks (e.g., combinational logic, arithmetic logic units (ALUs), registers, etc.) as part of the functional circuit 530.

Figure 6:
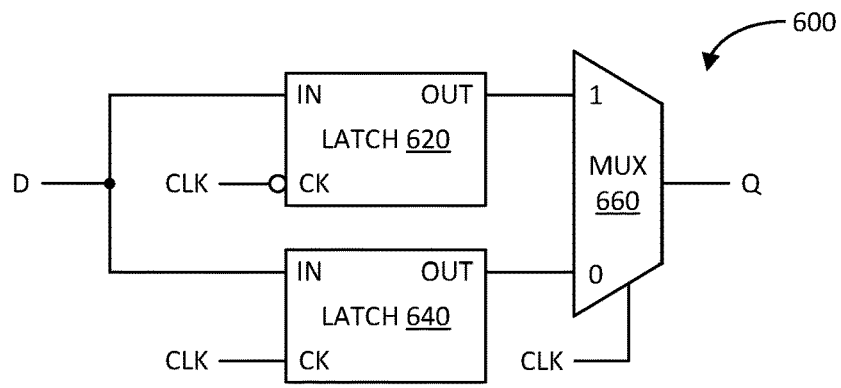
FIG. 6 illustrates a block diagram of an example dual-edge-triggered (DET) flip-flop (FF) in accordance with another aspect of the disclosure.

FIG. 6 illustrates a block diagram of an example dual-edge-triggered (DET) flip-flop (FF) 600 in accordance with another aspect of the disclosure. The DET FF 600 may be an example detailed implementation of any of the set of DET FFs 545-1 to 545-N of data processing circuit 500.

In particular, the DET FF 600 includes a first latch 620, a second latch 640, and a multiplexer 660. The first latch 620 includes a data input (IN) configured to receive an input data signal (D), a complementary (e.g., inverting) clock input (CK) configured to receive a clock signal CLK, and a data output (OUT) coupled to a first input "1" of the multiplexer 660. Similarly, the second latch 640 includes a data input (IN) configured to receive the input data signal (D), a non-complementary clock input (CK) configured to receive the clock signal CLK, and a data output (OUT) coupled to a second input "0" of the multiplexer 660. The multiplexer 660 further includes a select input configured to receive the clock signal CLK, and an output configured to produce an output data signal (Q).

In operation, when the clock signal CLK has a falling transition to a logic zero (0) or low, the first latch 620 becomes transparent and the second latch 640 becomes opaque. The first latch 620 being transparent accepts the current data D(t). The second latch 640 being opaque latches the previous data D(t−1) while blocking or preventing the current data D(t) from affecting the latched previous data D(t−1). The clock signal CLK being at a logic zero (0) or low causes the multiplexer 660 to select the latched previous data D(t−1) as the previous output data Q(t−1). When the clock signal CLK has a rising transition to a logic one (1) or high, the first latch 620 becomes opaque and the second latch 640 becomes transparent. The second latch 640 being transparent accepts the next data D(t+1). The first latch 620 being opaque latches the current data D(t) while blocking or preventing the next data D(t+1) from affecting the latched current data D(t). The clock signal CLK being at a logic one (1) or high causes the multiplexer 660 to select the latched current data D(t) as the current output data Q(t). Thus, the DET FF 600 effectuates data movement on both the rising and falling edges of the clock signal CLK.

Figure 7:
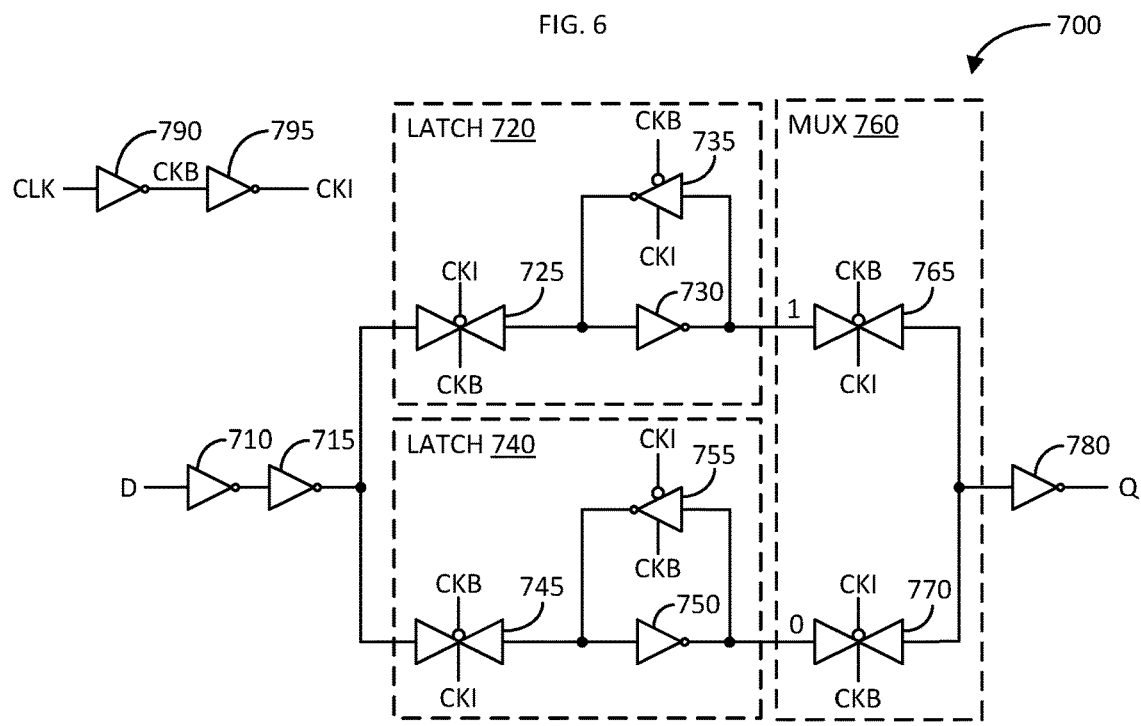
FIG. 7 illustrates a block diagram of another example dual-edge-triggered (DET) flip-flop (FF) in accordance with another aspect of the disclosure.

FIG. 7 illustrates a block diagram of another example dual-edge-triggered (DET) flip-flop (FF) 700 in accordance with another aspect of the disclosure. The DET FF 700 may be a more detailed implementation of the DET FF 600 previously discussed.

The DET FF 700 includes an input pair of cascaded inverters 710 and 715, a first latch 720, a second latch 740, a multiplexer 760, and an output inverter 780. Additionally, the DET FF 700 includes a pair of cascaded inverters 790 and 795 configured to generate a complementary clock signal (CKB) and a non-complementary clock signal (CKI) based on an input clock signal (CLK), respectively. The input pair of cascaded inverters 710 and 715 serve as a buffer configured to receive an input data signal D and regenerate the data signal D at the inputs of the first and second latches 720 and 740.

The first latch 720 includes a transmission gate 725, and a latch circuit including latch inverter 730 and latch tristate inverter 735. The transmission gate 725 includes an input coupled to the output of the inverter 715 to receive the data signal D therefrom. The transmission gate 725 further includes complementary and non-complementary control inputs configured to receive the non-complementary clock signal CKI and the complementary clock signal CKB, respectively. The transmission gate 725 includes an output coupled to an input of the latch inverter 730 and an output of the latch tristate inverter 735. The latch inverter 730 includes an output coupled to an input of the latch tristate inverter 735. The latch tristate inverter 735 further includes complementary and non-complementary control inputs configured to receive the complementary clock signal CKB and the non-complementary clock signal CKI, respectively.

The second latch 740 includes a transmission gate 745, and a latch circuit including latch inverter 750 and latch tristate inverter 755. The transmission gate 745 includes an input coupled to the output of the inverter 715 to receive the data signal D therefrom. The transmission gate 745 further includes complementary and non-complementary control inputs configured to receive the complementary clock signal CKB and the non-complementary clock signal CKI, respectively. The transmission gate 745 includes an output coupled to an input of the latch inverter 750 and an output of the latch tristate inverter 755. The latch inverter 750 includes an output coupled to an input of the latch tristate inverter 755. The latch tristate inverter 755 further includes complementary and non-complementary control inputs configured to receive the non-complementary clock signal CKI and the complementary clock signal CKB, respectively.

The multiplexer 760 includes a first transmission gate 765 and a second transmission gate 770. The first transmission gate 765 includes an input, serving as the first input "1" of the multiplexer 760, coupled to an output of the first latch 720 (e.g., to the output of the latch inverter 730). The first transmission gate 765 further includes complementary and non-complementary control inputs configured to receive the complementary clock signal CKB and the non-complementary clock signal CKI, respectively. The second transmission gate 770 includes an input, serving as the second input "0" of the multiplexer 760, coupled to an output of the second latch 740 (e.g., to the output of the latch inverter 750). The second transmission gate 770 further includes complementary and non-complementary control inputs configured to receive the non-complementary clock signal CKI and the complementary clock signal CKB, respectively. The first and second transmission gates 765 and 770 include outputs coupled together, and to an input of the output inverter 780. The output inverter 780 includes an output configured to produce an output data signal Q.

In operation, when the clock signal CLK has a falling transition to a logic zero (0) or low, the inverter 790 generates the complementary clock signal CKB as a logic one (1) or high, and the inverter 795 generates the non-complementary clock signal CKI as a logic zero (0) or low. In response, the first latch 720 becomes transparent to accept the current data D(t) from the input pair of cascaded inverters 710 and 715, the second latch 740 becomes opaque to latch the complementary previous data $\overline{D}(t-1)$ and block the current data D(t) from affecting the latched complementary previous data $\overline{D}(t-1)$, the multiplexer 760 outputs the latched complementary previous data $\overline{D}(t-1)$ from the second latch 740, and the output inverter 780 inverts the complementary previous data $\overline{D}(t-1)$ to generate the previous output data Q(t-1).

More specifically, based on CKI=0 and CKB=1, the first latch 720 becomes transparent because the transmission gate 725 is not gated and passes the current data D(t) to the open latch circuit 730/735 due to the disabled tristate inverter 735. The second latch 740 becomes opaque because the transmission gate 745 is gated and prevents the current data D(t) from affecting the latching of the complementary previous data $\overline{D}(t-1)$ by the latch circuit 750/755 due to the enabled tristate inverter 755. The first transmission gate 765 of the multiplexer 760 is gated and the second transmission gate 770 is not gated to pass the latched complementary previous data $\overline{D}(t-1)$ to the output inverter 780 to generate the previous output data Q(t-1).

When the clock signal CLK has a rising transition to a logic one (1) or high, the inverter 790 generates the complementary clock signal CKB as a logic zero (0) or low, and the inverter 795 generates the non-complementary clock signal CKI as a logic one (1) or high. In response, the first latch 720 becomes opaque to latch the complementary current data $\overline{D}(t)$ and block the next data D(t+1) from affecting the latched complementary current data $\overline{D}(t)$, the second latch 740 becomes transparent to accept the next data D(t+1) from the input pair of cascaded inverters 710 and 715, the multiplexer 760 outputs the latched complementary current data $\overline{D}(t)$ from the first latch 720, and the output inverter 780 inverts the complementary current data $\overline{D}(t)$ to generate the current output data Q(t).

More specifically, based on CKI=1 and CKB=0, the first latch 720 becomes opaque because the transmission gate 725 is gated and prevents the next data D(t+1) from affecting the latching of the complementary current data $\overline{D}(t)$ by the latch circuit 730/735 due to the enabled tristate inverter 735. The second latch 740 becomes transparent because the transmission gate 745 is not gated and passes the next data D(t+1) to the open latch circuit 750/755 due to the disabled tristate inverter 755. The first transmission gate 765 of the multiplexer 760 is not gated to pass the latched complementary current data $\overline{D}(t)$ to the output inverter 780 to generate the current output data Q(t), and the second transmission gate 770 is gated.

Figure 8A:
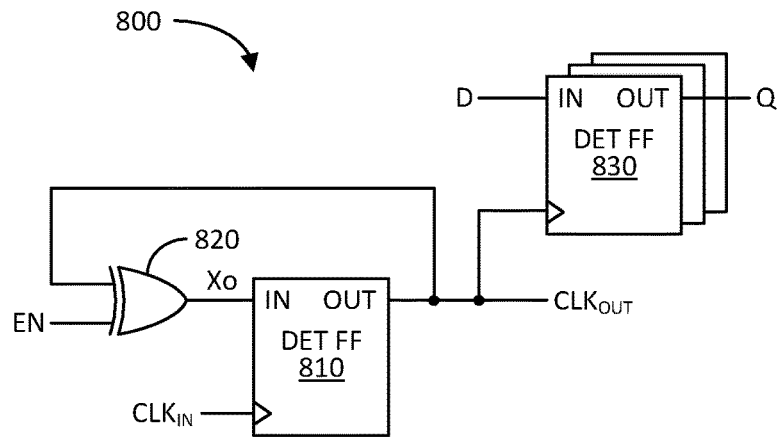
FIG. 8A illustrates a block diagram of an example clock gating circuit (CGC) for dual-edge-triggered (DET) flip-flops (FFs) in accordance with another aspect of the disclosure.

FIG. 8A illustrates a block diagram of an example clock gating circuit (CGC) 800 for dual-edge-triggered (DET) flip-flops (FFs) in accordance with another aspect of the disclosure. The CGC 800 may be an example detailed implementation of any of the CGCs 515 and 535 of data processing circuit 500.

The CGC 800 includes a dual-edge-triggered (DET) flip-flop (FF) 810 and an exclusive-OR gate 820. The DET FF 810 includes an input (IN) coupled to an output of the exclusive-OR gate 820, a clock input configured to receive an input clock signal $CLK_{IN}$, and an output (OUT) configured to generate an output clock signal $CLK_{OUT}$ at an output coupled to the clock inputs of the set of DET FFs 830. The exclusive-OR gate 820 includes a first input coupled to the output of the DET FF 810. The exclusive-OR gate 820 includes a second input configured to receive an enable signal (EN). The operation of the CGC 800 is discussed further herein with reference to FIG. 8B.

Figure 8B:
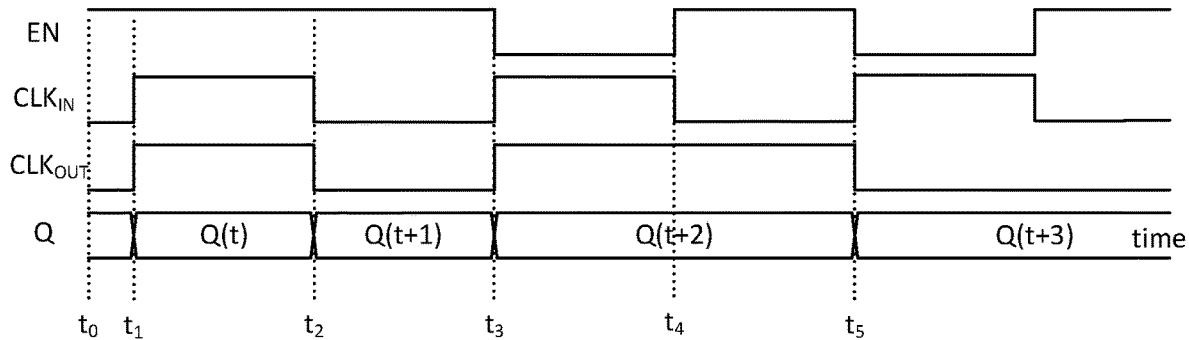
FIG. 8B illustrates a timing diagram of example signals associated with clock gating circuit (CGC) of FIG. 8A in accordance with another aspect of the disclosure.

FIG. 8B illustrates a timing diagram of example signals associated with DET CGCs, such as CGC 800 (and others) in accordance with another aspect of the disclosure. The horizontal axis of the timing diagram represents time. From top to bottom, the vertical axis represents logic states of the enable signal EN, the input clock signal $CLK_{IN}$, the output clock signal $CLK_{OUT}$, and the output data (Q) of the set of DET FFs 830. As discussed below, a difference between the SET CGC 400 and the DET CGC 800 is that when the enable signal EN is deasserted (e.g., EN=0), the output clock signal CGC generated by the SET CGC 400 goes to a logic zero (0) or low, whereas the output clock signal CGC generated by the DET CGC 800 stays at the level at the time the enable signal EN is deasserted.

For example, when the enable signal is asserted (e.g., a logic one (1) or high) during time interval $t_0$ to $t_3$, the exclusive-OR gate 820 operates as an inverter to feedback the inverted output clock signal $CLK_{OUT}$ back to the input (IN) of the DET FF 810 (e.g., the exclusive-OR gate output Xo=$CLKB_{OUT}$). Thus, for every edge or transition of the input clock signal $CLK_{IN}$, the DET FF 810 concurrently generates a corresponding edge or transition of the output clock signal $CLK_{OUT}$, although the output clock signal $CLK_{OUT}$ may be in-phase or 180 degrees out-of-phase with the input clock signal $CLK_{IN}$, as discussed further herein. In this example, during time interval $t_0$ to $t_3$, the output clock signal $CLK_{OUT}$ is in-phase with the input clock signal $CLK_{IN}$. As the output clock signal $CLK_{OUT}$ exhibits edges or transitions at times $t_1$, $t_2$, and $t_3$, the set of DET flip-flops 830 clocks out the output data Q(t), Q(t+1), and Q(t+2), respectively.

At time $t_3$, the enable signal EN is deasserted (e.g., EN=0) when the output clock signal $CLK_{OUT}$ is at a high logic level. In response, the exclusive-OR gate 820 operates as a buffer to maintain its output signal Xo at the last logic state of the output clock signal $CLK_{OUT}$ (e.g., a high logic state). Accordingly, when the following edge or transition of the input clock signal $CLK_{IN}$ occurs at time $t_4$, the output clock signal $CLK_{OUT}$ remains fixed at the last logic level (e.g., a high logic state).

Also, in accordance with this example, the enable signal EN becomes asserted (e.g., EN=1) at time $t_4$, where the exclusive-OR gate 820 is configured again as an inverter to output the inverted output clock signal $CLK_{OUT}$ to the input of the DET FF 810. Accordingly, at time $t_5$ when the input clock signal $CLK_{IN}$ experiences another edge or transition, the output clock signal $CLK_{OUT}$ experiences a falling edge or transition. Note that at such time $t_5$, the output clock signal $CLK_{OUT}$ is 180 degrees out-of-phase with the input clock signal $CLK_{IN}$. The falling edge or transition of the output clock signal $CLK_{OUT}$ at time $t_5$ causes the set of DET FFs 830 to clock out the next output data Q(t+3).

An issue with the DET CGC 800 is that it generally introduces or adds duty cycle distortion (DCD) to the output clock signal $CLK_{OUT}$. As previously discussed, a DET sequential circuit is more susceptible to DCD compared to a SET sequential circuit. This is because DCD also affects the timing of the "falling" clock edge or transition, which effectuates data movement in a DET sequential circuit, but does not in a SET sequential circuit. A root cause of the DCD is that the DET FF 810 operates under the control of the complementary and non-complementary versions of the input clock signal $CLK_{IN}$. Within the DET FF 810, the skew and/or delay associated with the rising and falling edges of internally-generated clock signals CKI and CKB may be significantly different (e.g., often referred to as clock imbalance), as well as the skew and/or delay associated with the rising and falling edges of the exclusive-OR gate 820 output signal Xo and the output clock signal $CLK_{OUT}$. Such skew and/or delay differences typically manifest as DCD in the output clock signal $CLK_{OUT}$.

Figure 9:
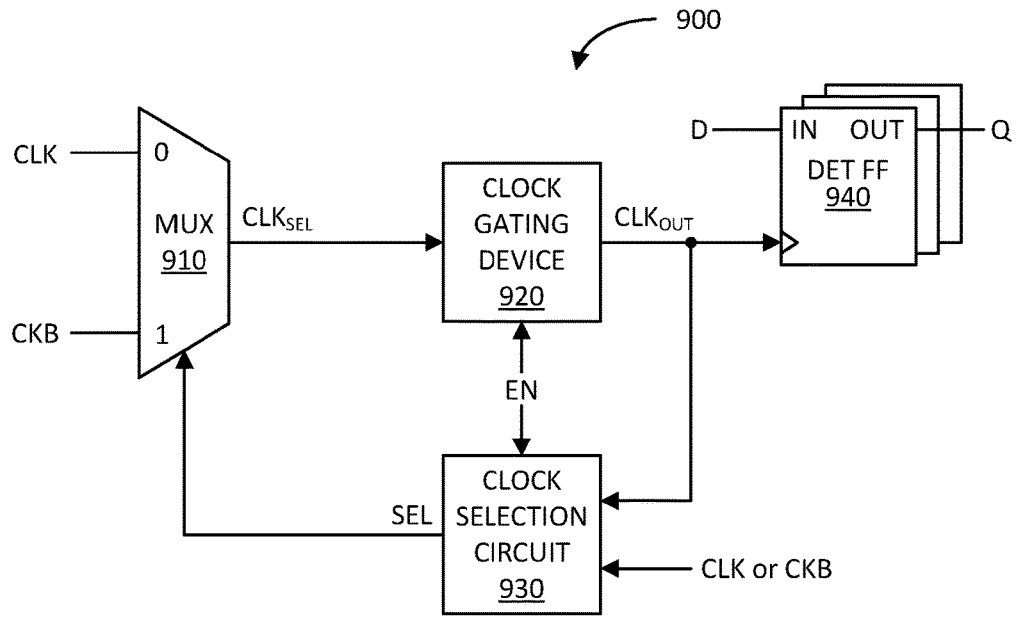
FIG. 9 illustrates a block diagram of another example clock gating circuit (CGC) for dual-edge-triggered (DET) flip-flops (FFs) in accordance with another aspect of the disclosure.

FIG. 9 illustrates a block diagram of another example clock gating circuit (CGC) 900 for a set of dual-edge-triggered (DET) flip-flops (FFs) 940 in accordance with another aspect of the disclosure. The CGC 900 may be an example detailed implementation of any of the CGCs 515 and 535 of data processing circuit 500. The CGC 900 does not generally suffer from clock imbalance issues as the control of the clock gating device is based on the enable signal not complementary clock signals. Accordingly, the CGC 900 substantially minimizes duty cycle distortion (DCD) that it adds to the output clock signal.

In particular, the CGC 900 includes a multiplexer 910, a clock gating device 920, and a clock selection circuit 930. The multiplexer 910 includes a first input "0" configured to receive a non-complementary clock signal CLK and a second input "1" configured to receive a complementary clock signal CKB. Additionally, the multiplexer 910 includes a select input coupled to an output of the clock selection circuit 930 to receive a select signal therefrom. The multiplexer 910 is configured to output either the non-complementary clock signal CLK and the complementary clock signal CKB as a selected clock signal $CLK_{SEL}$ based on the state of the select signal.

The clock gating device 920 includes a clock input coupled to an output of the multiplexer 910 to receive the selected clock signal $CLK_{SEL}$ therefrom. Further, the clock gating device 920 includes a control input configured to receive an enable signal EN. Additionally, the clock gating device 920 includes an output configured to generate an output clock signal $CLK_{OUT}$ by selectively gating/outputting the selected clock signal $CLK_{SEL}$ based on a state of the enable signal EN. As previously discussed, the clock gating device 920 maintains the output clock signal $CLK_{OUT}$ at the fixed logic level when the enable signal EN is deasserted. When the enable signal EN is asserted, the clock gating device 920 passes the selected clock signal $CLK_{SEL}$ as the output clock signal $CLK_{OUT}$. The output of the clock gating device 920 is coupled to clock inputs of the set of DET FFs 940.

The clock selection circuit 930 includes a first input coupled to the output of the clock gating device 920 to receive the output clock signal $CLK_{OUT}$ therefrom, and a second input configured to receive the non-complementary clock signal CLK or the complementary clock signal CKB. Additionally, the clock selection circuit 930 includes a control input to receive the enable signal EN. The clock selection circuit 930 is configured to generate the select signal so that the multiplexer 910 outputs the non-complementary clock signal CLK or the complementary clock signal CKB to generate a transition (e.g., rising or falling) on the output clock signal $CLK_{OUT}$ when the enable signal EN becomes asserted. That is, if the output clock signal $CLK_{OUT}$ is at a low logic level, the selected clock signal CLK or CKB generates a rising transition on the output clock signal $CLK_{OUT}$. Conversely, if the output clock signal $CLK_{OUT}$ is at a high logic level, the selected clock signal CLK or CKB generates a falling transition on the output clock signal $CLK_{OUT}$.

For example, with reference to both FIGS. 8B and 9, during time interval $t_0$ to $t_3$, the output clock signal $CLK_{OUT}$ is in phase with the input clock signal $CLK_{IN}$, which may be referred to as the non-complementary clock signal CLK. In such case, the clock selection circuit 930 generates the select signal (e.g., as a logic zero (0)) to cause the multiplexer 910 to output the non-complementary clock signal CLK as the selected clock signal $CLK_{SEL}$. When the enable signal EN becomes deasserted at time $t_3$ and then becomes asserted again at time $t_4$, the output clock signal $CLK_{OUT}$ is at a high logic level whereas the input clock signal $CLK_{IN}$ is at a low logic level, i.e., the output clock signal $CLK_{OUT}$ is 180 degrees out-of-phase with the input clock signal $CLK_{IN}$. In such case, the clock selection circuit 930 generates the select signal (e.g., as a logic one (1)) to cause the multiplexer 910 to output the complementary clock signal CKB as the selected clock signal $CLK_{SEL}$.

Figure 10:
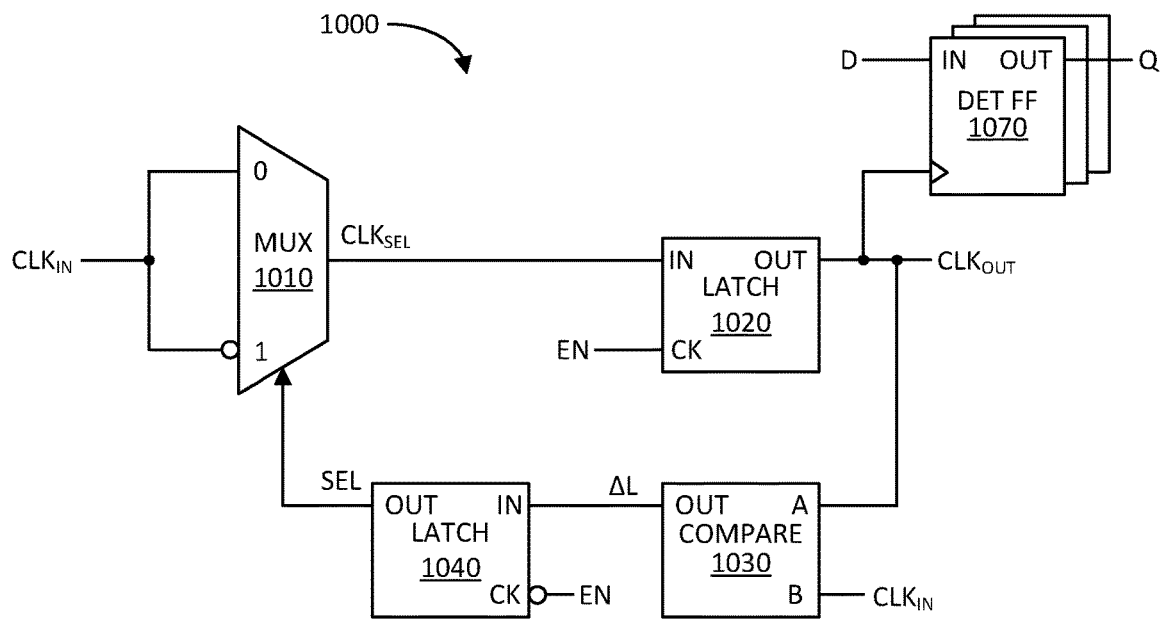
FIG. 10 illustrates a block diagram of another example clock gating circuit (CGC) for dual-edge-triggered (DET) flip-flops (FFs) in accordance with another aspect of the disclosure.

FIG. 10 illustrates a block diagram of another example clock gating circuit (CGC) 1000 for a set of dual-edge-triggered (DET) flip-flops (FFs) 1070 in accordance with another aspect of the disclosure. The CGC 1000 may be an example more detailed implementation of the CGC 900 previously discussed. Additionally, the CGC 1000 may be an example detailed implementation of any of the CGCs 515 and 535 of data processing circuit 500.

In particular, the CGC 1000 includes a multiplexer 1010, a first latch 1020, a logic level comparator 1030, and a second latch 1040. With reference to CGC 900, the multiplexer 1010 corresponds to the multiplexer 910, the first latch 1020 corresponds to the clock gating device 920, and the logic level comparator 1030 and second latch 1040 collectively corresponds to the clock selection circuit 930.

More specifically, the multiplexer 1010 includes a non-inverting input "0" and an inverting input "1", both configured to receive an input clock signal $CLK_{IN}$. Additionally, the multiplexer 1010 includes a select input coupled to an output of the second latch 1040 to receive a select signal therefrom. The multiplexer 1010 is configured to output a selected clock signal $CLK_{SEL}$ being either the non-inverted or inverted input clock signal $CLK_{IN}$ based on the state of the select signal.

The first latch 1020 includes a "data" input coupled to an output of the multiplexer 1010 to receive the selected clock signal $CLK_{SEL}$ therefrom. Further, the first latch 1020 includes a "clock" input configured to receive an enable signal EN. Additionally, the first latch 1020 includes an output configured to generate an output clock signal $CLK_{OUT}$ by selectively gating/outputting the selected clock signal $CLK_{SEL}$ based on a state of the enable signal EN. For example, the first latch 1020 maintains the output clock signal $CLK_{OUT}$ fixed at the same logic level when the enable signal EN is deasserted (e.g., EN=0). When the enable signal EN is asserted (e.g., EN=1), the first latch 1020 passes the selected clock signal $CLK_{SEL}$ as the output clock signal $CLK_{OUT}$. The output of the first latch 1020 is coupled to clock inputs of the set of DET FFs 1070.

The logic level comparator 1030 includes an input "A" coupled to the output of the first latch 1020 to receive the output clock signal $CLK_{OUT}$ therefrom. The logic level comparator 1030 further includes a second input "B" configured to receive the input clock signal $CLK_{IN}$. The logic level comparator 1030 is configured to generate a logic level difference signal ΔL based on a comparison of the output clock signal $CLK_{OUT}$ and the input clock signal $CLK_{IN}$. For example, if the output clock signal $CLK_{OUT}$ is at the same logic level as the input clock signal $CLK_{IN}$, the logic level comparator 1030 generates the logic level difference signal ΔL at a first logic value (e.g., a logic zero (0)). If the output clock signal $CLK_{OUT}$ is at an opposite logic level as the input clock signal $CLK_{IN}$, the logic level comparator 1030 generates the logic level difference signal ΔL at a second logic value (e.g., a logic one (1)).

The second latch 1040 includes a "data" input coupled to an output of the logic level comparator 1030 to receive the logic level difference signal ΔL therefrom. The second latch 1040 includes an inverting input configured to receive the enable signal EN. Further, the second latch 1040 includes a "data" output configured to generate the select signal, which is the logic level difference signal ΔL latched in response to the enable signal EN being asserted (e.g., EN=1).

In operation, with reference to both FIGS. 8B and 10, during time interval $t_0$ to $t_3$, the enable signal EN is asserted (e.g., EN=1). In response, the first latch 1020 is transparent and the second latch 1040 is opaque. Also, during this time interval $t_0$ to $t_3$, the output clock signal $CLK_{OUT}$ is at the same logic level as (e.g., in-phase with) the input clock signal $CLK_{IN}$. Accordingly, the logic level comparator 1030 generates the logic level difference signal ΔL as a logic zero (0), which has been latched by the opaque second latch 1040 to generate the select signal as a logic zero (0). In response to the select signal being a logic zero (0), the multiplexer 1010 outputs the input clock signal $CLK_{IN}$ as the selected clock signal $CLK_{SEL}$.

When the enable signal EN becomes deasserted (e.g., EN=0) at time $t_3$ until time $t_4$, the first latch 1020 becomes opaque and holds the output clock signal $CLK_{OUT}$ at the last state or level, which in this example is a high logic level state. During time interval $t_3$ to time $t_4$ while the enable signal EN is deasserted, the second latch 1040 is transparent to cause the select signal to follow the logic level difference signal ΔL. At time $t_4$, the enable signal EN becomes asserted again, and the first and second latches 1020 and 1040 responsively become transparent and opaque, respectively. At such time $t_4$, the output clock signal $CLK_{OUT}$ is at an opposite logic level as (e.g., 180 degrees out-of-phase with) the input clock signal $CLK_{IN}$, and the logic level comparator 1030 responsively generates the logic level difference signal ΔL at a logic one (1). The opaque second latch 1040 latches the logic level difference signal ΔL to generate the select signal at a logic one (1), which causes the multiplexer 1010 to output the inverted input clock signal $CLK_{IN}$ as the selected clock signal $CLK_{SEL}$.

Figure 11:
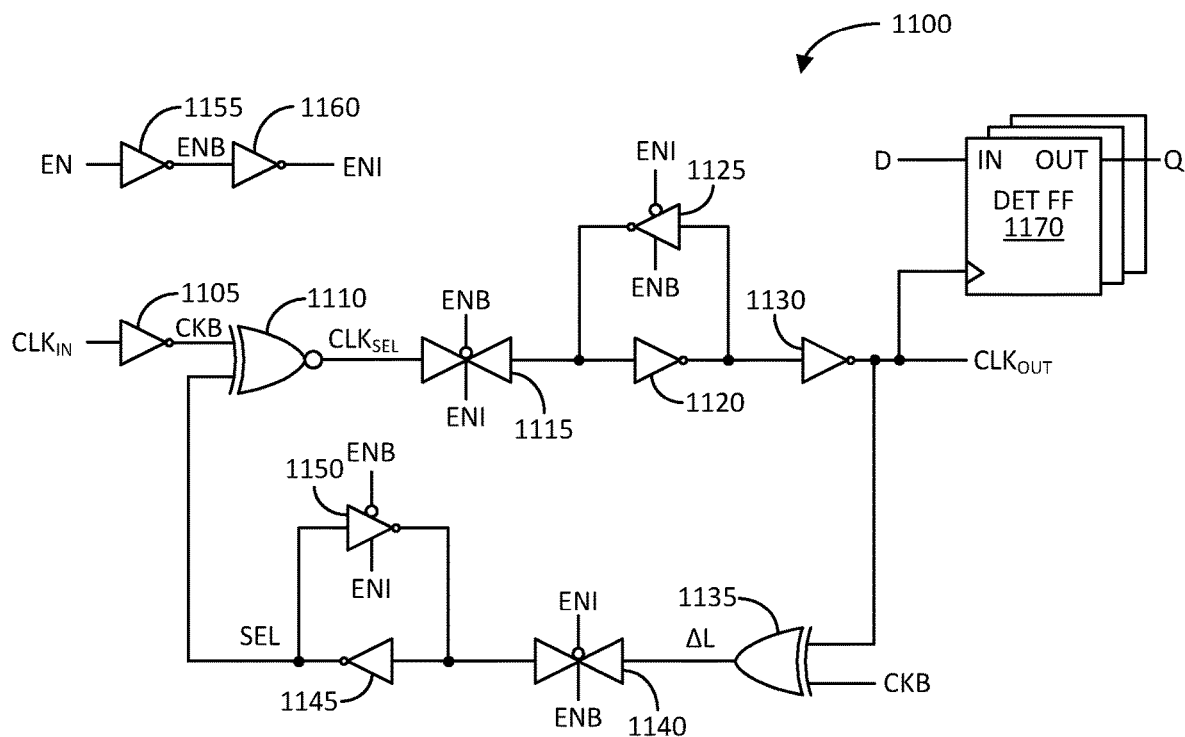
FIG. 11 illustrates a block/schematic diagram of another example clock gating circuit (CGC) for dual-edge-triggered (DET) flip-flops (FFs) in accordance with another aspect of the disclosure.

FIG. 11 illustrates a block/schematic diagram of another example clock gating circuit (CGC) 1100 for a set of dual-edge-triggered (DET) flip-flops (FFs) 1170 in accordance with another aspect of the disclosure. The CGC 1100 may be an example more detailed implementation of the CGC 1000 previously discussed. Additionally, the CGC 1100 may be an example detailed implementation of any of the CGCs 515 and 535 of data processing circuit 500.

In particular, the CGC 1100 includes an input inverter 1105, an exclusive-NOR gate 1110, a first latch including a transmission gate 1115, a latch inverter 1120, a latch tristate inverter 1125, and an output inverter 1130, an exclusive-OR gate 1135, and a second latch including a transmission gate 1140, a latch inverter 1145, and a latch tristate inverter 1150. Additionally, the CGC 1100 includes a pair of cascaded inverters 1155 and 1160 configured to generate a complementary enable signal ENB and a non-complementary enable signal ENI based on an input enable signal EN, respectively.

With reference to CGC 1000, the input inverter 1105 and the exclusive-NOR gate 1110 correspond to the multiplexer 1010, the first latch including the transmission gate 1115, latch inverter 1020, latch tristate inverter 1125, and output inverter 1130 corresponds to the first latch 1020, the exclusive-OR gate 1135 corresponds to the logic level comparator 1030, and the second latch including the transmission gate 1140, latch inverter 1145, and latch tristate inverter 1150 corresponds to the second latch 1040.

More specifically, the input inverter 1105 includes an input configured to receive an input clock signal $CLK_{IN}$, and an output to generate a complementary input clock signal CKB. The exclusive-NOR gate 1110 includes a first input coupled to the output of the input inverter 1105 to receive the complementary input clock signal CKB therefrom, a second input coupled to an output of the latch inverter 1145 to receive a select signal therefrom, and an output configured to generate a selected clock signal $CLK_{SEL}$ based on the state of the select signal.

The transmission gate 1115 includes a "data" input coupled to the output of the exclusive-NOR gate 1110 to receive the selected clock signal $CLK_{SEL}$ therefrom. The transmission gate 1115 further includes a complementary control input configured to receive the complementary enable signal ENB, and a non-complementary control input configured to receive the non-complementary enable signal ENI. The transmission gate 1115 includes an output coupled to an input of the latch inverter 1120 and an output of the latch tristate inverter 1125. The latch inverter 1120 includes an output coupled to respective inputs of the latch tristate inverter 1125 and the output inverter 1130. The latch tristate inverter 1125 includes a complementary control input configured to receive the non-complementary enable signal ENI, and a non-complementary control input configured to receive the complementary enable signal ENB. The output inverter 1130 includes an output at which an output clock signal $CLK_{OUT}$ is generated. The output of the output inverter 1130 is coupled to clock inputs of the set of DET FFs 1170 to provide the output clock signal $CLK_{OUT}$ thereto.

The exclusive-OR gate 1135 includes a first input coupled to the output of the output inverter 1130 to receive the output clock signal $CLK_{OUT}$ therefrom. The exclusive-OR gate 1135 further includes a second input configured to receive the complementary input clock signal CKB. The exclusive-OR gate 1135 is configured to generate a logic level difference signal ΔL based on a logic level difference between the output clock signal $CLK_{OUT}$ and the complementary input clock signal CKB.

The transmission gate 1140 includes a "data" input coupled to the output of the exclusive-OR gate 1135 to receive the logic level difference signal ΔL therefrom. The transmission gate 1140 further includes a complementary control input configured to receive the non-complementary enable signal ENI, and a non-complementary control input configured to receive the complementary enable signal ENB. The transmission gate 1140 includes an output coupled to an input of the latch inverter 1145 and an output of the latch tristate inverter 1150. The latch inverter 1145 includes an output coupled to the input of the latch tristate inverter 1150. The latch tristate inverter 1150 includes a complementary control input configured to receive the complementary enable signal ENB, and a non-complementary control input configured to receive the non-complementary enable signal ENI.

In operation, with reference to both FIGS. 8B and 11, during time interval $t_0$ to $t_3$, the enable signal EN is asserted (e.g., EN=1). In response, the cascaded inverters 1155 and 1160 responsively generate the complementary enable signal ENB as a logic zero (0) and the non-complementary enable signal ENI as a logic one (1). As a result, the first latch 1115/1120/1125 is transparent and the second latch 1140/1145/1150 is opaque. That is, the signals ENB=0 and ENI=1 enable the transmission gate 1115 and disable the latch tristate inverter 1125. In such state, the selected clock signal $CLK_{SEL}$ propagates to form the output clock signal $CLK_{OUT}$ via the transmission gate 1115, latch inverter 1120, and output inverter 1130.

Also, during time interval $t_0$ to $t_3$, the output clock signal $CLK_{OUT}$ is at an opposite logic level as (e.g., 180 degrees out-of-phase with) the complementary input clock signal CKB. Accordingly, the exclusive-OR gate 1135 generates the logic level difference signal ΔL as a logic one (1). The second latch 1140/1145/1150 being opaque latches the inverted logic level difference signal ΔL to generate the select signal as a logic zero (0). That is, the signals ENB=0 and ENI=1 disables the transmission gate 1140 and enables the latch tristate inverter 1150. In such state, the logic level difference signal ΔL=1 is latched and inverted to generate the select signal as a logic zero (0). The logic zero (0) at the second input of the exclusive-NOR gate 1110 causes the exclusive-NOR gate 1110 to invert the complementary input clock signal CKB to generate the selected clock signal $CLK_{SEL}$ as the input clock signal $CLK_{IN}$.

When the enable signal EN becomes deasserted (e.g., EN=0) at time $t_3$ until time $t_4$, the first latch 1115/1120/125 becomes opaque and holds the output clock signal $CLK_{OUT}$ fixed at the last state or level, which in this example is a high logic level state. That is, the signals ENB=1 and ENI=0 disable the transmission gate 1115 and enable the latch tristate inverter 1125. In such state, the last state of the output clock signal $CLK_{OUT}$ is maintained by the opaque first latch. During time interval $t_3$ to time $t_4$ while the enable signal EN is deasserted, the second latch 1140/1145/1150 is transparent to cause the select signal to inversely follow the logic level difference signal ΔL. That is, the signals ENB=1 and ENI=0 enables the transmission gate 1140 and disables the latch tristate inverter 1150. In such state, the logic level difference signal ΔL propagates via the latch inverter 1145 to the select signal.

At time $t_4$, the enable signal EN becomes asserted again, and the first and second latches responsively become transparent and opaque, respectively. At such time $t_4$, the output clock signal $CLK_{OUT}$ is at the same logic level as (e.g., in-phase with) the complementary input clock signal CKB, and the exclusive-OR gate 1135 responsively generates the logic level difference signal ΔL at a logic zero (0). The opaque second latch latches the logic level difference signal ΔL to generate the select signal at a logic one (1), which configures the exclusive-NOR gate 1110 as a buffer to output the complementary input clock signal $CKB_{IN}$ as the selected clock signal $CLK_{SEL}$.

Figure 12:
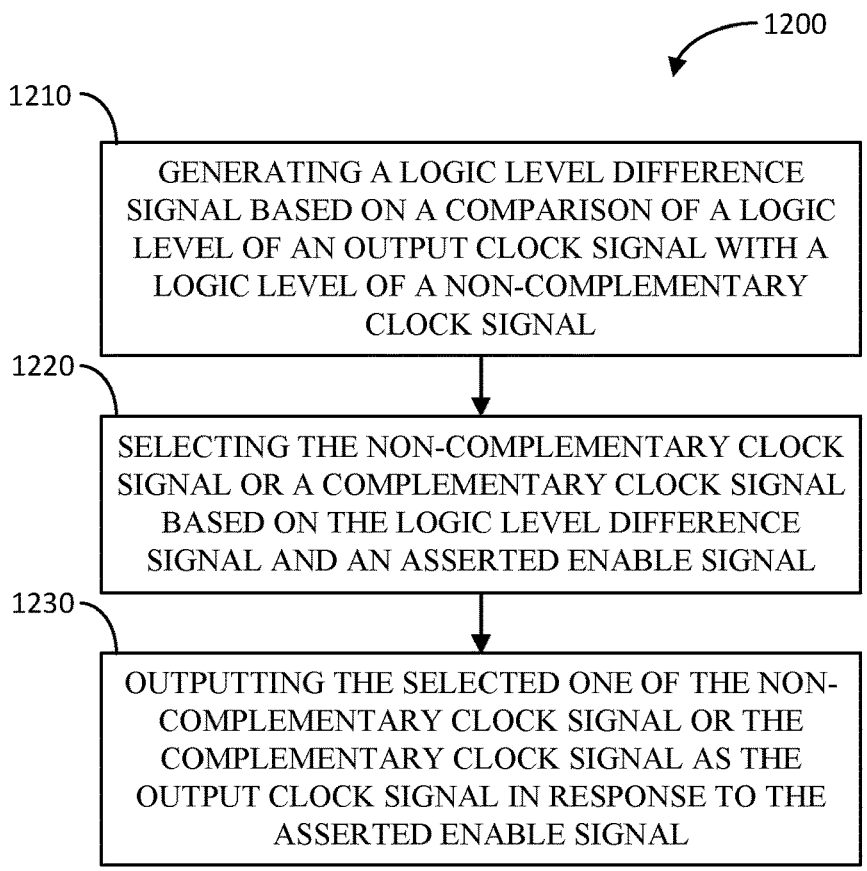
FIG. 12 illustrates a flow diagram of an example method of gating a clock signal in accordance with another aspect of the disclosure.

FIG. 12 illustrates a flow diagram of an example method 1200 of gating a clock signal in accordance with another aspect of the disclosure. The method 1200 includes generating a logic level difference signal based on a comparison of a logic level of an output clock signal with a logic level of a non-complementary clock signal (block 1210). Examples of means for generating a logic level difference signal based on a comparison of a logic level of an output clock signal with a logic level of a non-complementary clock signal include the clock selection circuit 930, logic level comparator 1030, and exclusive-OR gate 1135 of CGCs 900, 1000, and 1100, respectively.

The method 1200 further includes selecting the non-complementary clock signal or a complementary clock signal based on the logic level difference signal and an asserted enable signal (block 1220). Examples of means for selecting the non-complementary clock signal or a complementary clock signal based on the logic level difference signal and an asserted enable signal include the multiplexers 910 and 1010 of CGCs 900 and 1000, respectively, and the exclusive-NOR gate 1110 of CGC 1100.

Additionally, the method 1200 includes outputting the selected one of the non-complementary clock signal or the complementary clock signal as the output clock signal in response to the asserted enable signal (block 1230). Examples of means for outputting the selected one of the non-complementary clock signal or the complementary clock signal as the output clock signal in response to the asserted enable signal include clock gating device 920, the latch 1020, and the transmission gate 1115/latch inverter 1120/latch tristate inverter 1125/output inverter 1130 of CGCs 900, 1000, and 1100, respectively.

The selecting of the non-complementary clock signal or the complementary clock signal may include: selecting the non-complementary clock signal if the logic level difference signal is at a first logic value; and selecting the complementary clock signal if the logic level difference signal is at a second logic value. The method 1200 may further include maintaining the output clock signal at a fixed logic state in response to the enable signal becoming deasserted. Examples of means for maintaining the output clock signal at a fixed logic state and in response to the enable signal becoming deasserted include the clock gating device 920, latch 1020, and latch circuit including transmission gate 1115, latch inverter 1120, latch tristate inverter 1125, and output inverter 1130.

Figure 13:
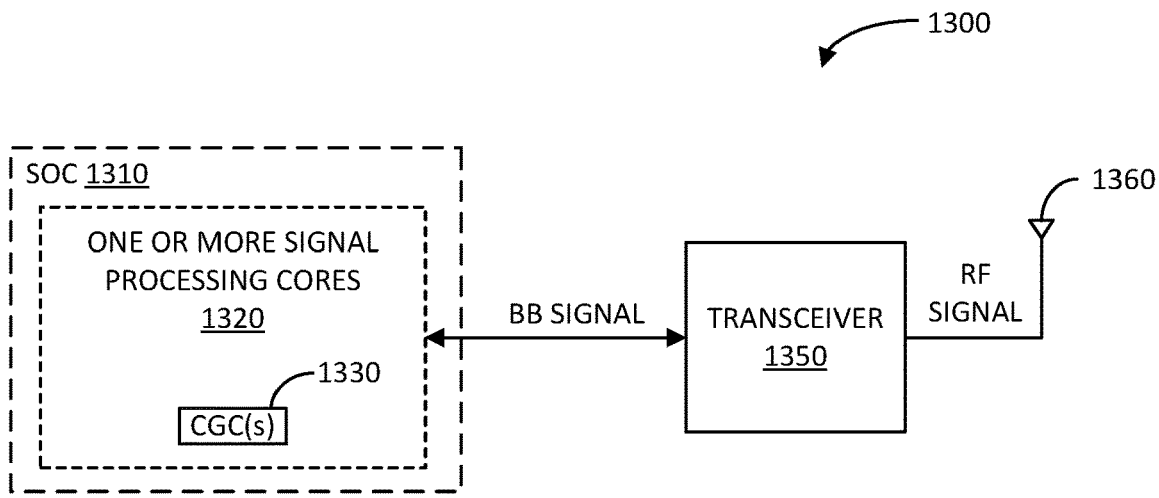
FIG. 13 illustrates a block diagram of an example wireless communication device in accordance with another aspect of the disclosure.

FIG. 13 illustrates a block diagram of an example wireless communication device 1300 in accordance with another aspect of the disclosure. The wireless communication device 1300 may be a smart phone, a desktop computer, laptop computer, tablet device, Internet of Things (IoT), wearable wireless device (e.g., wireless watch), and other types of wireless device.

In particular, the wireless communication device 1300 includes an integrated circuit (IC), which may be implemented as a system on chip (SOC) 1310. The SOC 1310 includes one or more signal processing cores 1320, and one or more clock gating circuits (CGCs) 1330. The one or more CGCs 1330 may each be implemented per any of the CGCs 900, 1000, and 1100 described herein. The one or more signal processing cores 1320 may be configured to generate a transmit baseband (BB) signal and process a received baseband (BB) signal based on one or more clock signals received from the one or more CGCs 1330.

The wireless communication device 1300 may further include a transceiver 1350 and at least one antenna 1360 (e.g., an antenna array). The transceiver 1350 is coupled to the one or more signal processing cores 1320 to receive therefrom the transmit BB signal and provide thereto the received BB signal. The transceiver 1350 is configured to convert the transmit BB signal into a transmit radio frequency (RF) signal, and convert a received RF signal into the received BB signal. The transceiver 1350 is coupled to the at least one antenna 1360 to provide thereto the transmit RF signal for electromagnetic radiation into a wireless medium for wireless transmission, and receive the received RF signal electromagnetically picked up from the wireless medium by the at least one antenna 1360.

The following provides an overview of aspects of the present disclosure:

Aspect 1: An apparatus, comprising: a clock gating circuit (CGC), comprising: a clock gating circuit configured to selectively gate/pass a selected clock signal based on an enable signal to generate an output clock signal; and a clock selection circuit configured to select a non-complementary clock signal or a complementary clock signal to generate the selected clock signal based on the output clock signal and the non-complementary clock signal or the complementary clock signal.

Aspect 2: The apparatus of aspect 1, wherein the clock gating device is configured to pass the selected clock signal based on the enable signal being asserted.

Aspect 3: The apparatus of aspect 1 or 2, wherein the clock gating device is configured to generate the output clock signal at a fixed logic level based on the enable signal being deasserted.

Aspect 4: The apparatus of aspect 3, wherein the fixed logic level is a logic level of the output clock signal at substantially a time when the enable signal becomes deasserted.

Aspect 5: The apparatus of any one of aspects 1-4, wherein the clock selection circuit is configured to select the non-complementary clock signal or the complementary clock in response to the enable signal becoming asserted.

Aspect 6: The apparatus of any one of aspects 1-5, wherein the CGC further comprises a multiplexer including a first input configured to receive the non-complementary clock signal, a second input configured to receive the complementary clock signal, a select input configured to receive a select signal from the clock selection circuit, and an output configured to output the selected clock signal.

Aspect 7: The apparatus of any one of aspects 1-5, wherein the CGC further comprises a multiplexer including a non-inverting input configured to receive the non-complementary clock signal, an inverting input configured to receive and invert the non-complementary clock signal to generate the complementary clock signal, a select input configured to receive a select signal from the clock selection circuit, and an output configured to output the selected clock signal.

Aspect 8: The apparatus of any one of aspects 1-5, wherein the CGC further comprises a logic gate including a first input configured to receive the complementary clock signal, a second input configured to receive the select signal from the clock selection circuit, and an output configured to output the selected clock signal based on the select signal.

Aspect 9: The apparatus of aspect 8, wherein the logic gate comprises an exclusive-NOR gate.

Aspect 10: The apparatus of any one of aspects 1-9, wherein the clock gating device comprises a latch including a data input configured to receive the selected clock signal, a clock input configured to receive the enable signal, and a data output configured to output the output clock signal.

Aspect 11: The apparatus of any one of aspects 1-10, wherein the clock gating device comprises: a transmission gate including an input configured to receive the selected clock signal, a complementary control input configured to receive a complementary enable signal, and a non-complementary control input configured to receive a non-complementary enable signal; a latch inverter including an input coupled to an output of the transmission gate; and a latch tristate inverter including an input coupled to an output of the latch inverter, an output coupled to an input of the latch inverter, a complementary control signal configured to receive the non-complementary enable signal, and a non-complementary control signal configured to receive the complementary enable signal.

Aspect 12: The apparatus of aspect 11, wherein the CGC further comprises: a first inverter configured to generate the complementary enable signal based on the enable signal; and a second inverter configured to generate the non-complementary enable signal based on the complementary enable signal.

Aspect 13: The apparatus of aspect 11 or 12, wherein the clock gating device further comprises an output inverter coupled to an output of the latch inverter.

Aspect 14: The apparatus of any one of aspects 1-13, wherein the clock selection circuit comprises a logic level comparator including a first input configured to receive the output clock signal, a second input configured to receive the non-complementary clock signal or the complementary clock signal, and an output configured to output a logic level difference signal, wherein the selection of the non-complementary clock signal or the complementary clock is based on the logic level difference signal.

Aspect 15: The apparatus of aspect 14, wherein the logic level comparator comprises an exclusive-OR gate.

Aspect 16: The apparatus of aspect 14 or 15, wherein the clock selection circuit further comprises a latch including a data input coupled to an output of the logic level comparator, a clock input configured to receive the enable signal, and an output configured to generate a select signal to effectuate the selection of the non-complementary clock signal or the complementary clock signal.

Aspect 17: The apparatus of any one of aspects 14-16, wherein the clock selection circuit comprises: a transmission gate including an input coupled to an output of the logic level comparator, a complementary control input configured to receive a non-complementary enable signal, and a non-complementary control input configured to receive a complementary enable signal; a latch inverter including an input coupled to an output of the transmission gate; and a latch tristate inverter including an input coupled to an output of the latch inverter, an output coupled to an input of the latch inverter, a complementary control signal configured to receive the complementary enable signal, and a non-complementary control signal configured to receive the non-complementary enable signal.

Aspect 18: The apparatus of aspect 17, wherein the CGC further comprises: a first inverter configured to generate the complementary enable signal based on the enable signal; and a second inverter configured to generate the non-complementary enable signal based on the complementary enable signal.

Aspect 19: The apparatus of any one of aspects 1-18, further comprising a set of one or more dual-edge-triggered flip-flops including a set of one or more clock inputs configured to receive the output clock signal.

Aspect 20: An apparatus, comprising: a clock gating circuit (CGC), comprising: a multiplexer including a first input configured to receive a non-complementary clock signal and a second input configured to receive a complementary clock signal; a clock gating device including a first input coupled to an output of the multiplexer and a second input configured to receive an enable signal; and a clock selection circuit including a first input coupled to an output of the clock gating device, a second input configured to receive the non-complementary or complementary clock signal, a third input configured to receive the enable signal, and an output coupled to a select input of the multiplexer.

Aspect 21: The apparatus of aspect 20, wherein the clock gating device comprises a latch.

Aspect 22: The apparatus of aspect 20 or 21, wherein the clock gating circuit comprises: a transmission gate including an input coupled to the output of the multiplexer, a complementary control input configured to receive a complementary enable signal, and a non-complementary control input configured to receive a non-complementary enable signal; a latch inverter including an input coupled to an output of the transmission gate; and a latch tristate inverter including an input coupled to an output of the latch inverter, an output coupled to the input of the latch inverter, a complementary control signal configured to receive the non-complementary enable signal, and a non-complementary control signal configured to receive the complementary enable signal.

Aspect 23: The apparatus of any one of aspects 20-22, wherein the clock selection device comprises: a logic level comparator including a first input coupled to an output of the clock gating device and a second input configured to receive the non-complementary or complementary clock signal; and a latch including a first input coupled to the output of the logic level comparator, a second input configured to receive the enable signal, and the output coupled to the select input of the multiplexer.

Aspect 24: The apparatus of aspect 23, wherein the logic level comparator comprises a logic gate including the first input coupled to the output of the clock gating device, a second input configured to receive the non-complementary or complementary clock signal, and the output coupled to the first input of the latch.

Aspect 25: The apparatus of aspect 23 or 24, wherein the latch comprises: a transmission gate including the first input coupled to the output of the logic level comparator, the second input including a complementary control input configured to receive the enable signal, and a non-complementary control input configured to receive a complementary of the enable signal; a latch inverter including an input coupled to an output of the transmission gate; and a latch tristate inverter including an input coupled to an output of the latch inverter, an output coupled to the input of the latch inverter, a complementary control signal configured to receive the complementary enable signal, and a non-complementary control signal configured to receive the enable signal.

Aspect 26: The apparatus of any one of aspects 20-25, wherein the multiplexer comprises an inverter including the first input configured to receive the non-complementary clock signal, a logic gate including the second input coupled to an output of the inverter, the select input coupled to the output of the clock selection circuit, and the output coupled to the clock gating device.

Aspect 27: The apparatus of aspect 26, wherein the logic gate comprises an exclusive-NOR gate.

Aspect 28: A method, comprising: generating a logic level difference signal based on a comparison of a logic level of an output clock signal with a logic level of a non-complementary clock signal; selecting the non-complementary clock signal or a complementary clock signal based on the logic level difference signal and an asserted enable signal; and outputting the selected one of the non-complementary clock signal or the complementary clock signal as the output clock signal in response to the asserted enable signal.

Aspect 29: The method of aspect 28, wherein selecting the non-complementary clock signal or the complementary clock signal comprises: selecting the non-complementary clock signal if the logic level difference signal is at a first logic value; and selecting the complementary clock signal if the logic level difference signal is at a second logic value.

Aspect 30: The method of aspect 28 or 29, further comprising maintaining the output clock signal at a fixed logic state and in response to the enable signal becoming deasserted.

Aspect 31: An apparatus, comprising: means for generating a logic level difference signal based on a comparison of a logic level of an output clock signal with a logic level of a non-complementary clock signal; means for selecting the non-complementary clock signal or a complementary clock signal based on the logic level difference signal and an asserted enable signal; and means for outputting the selected one of the non-complementary clock signal or the complementary clock signal as the output clock signal in response to the asserted enable signal.

Aspect 32: The apparatus of aspect 31, wherein the means for selecting the non-complementary clock signal or the complementary clock signal comprises: means for selecting the non-complementary clock signal if the logic level difference signal is at a first logic value; and means for selecting the complementary clock signal if the logic level difference signal is at a second logic value.

Aspect 33: The apparatus of aspect 31 or 32, further comprising means for maintaining the output clock signal at a fixed logic state in response to the enable signal becoming deasserted.

Aspect 34: A wireless communication device, comprising: at least one antenna; a transceiver coupled to the at least one antenna; one or more signal processing cores coupled to the transceiver, wherein the one or more signal processing cores comprises one or more clock gating circuits each comprising: a clock gating circuit configured to selectively gate/pass a selected clock signal based on an enable signal to generate an output clock signal; and a clock selection circuit configured to select a non-complementary clock signal or a complementary clock to generate the selected clock signal based on the output clock signal and the non-complementary clock signal or the complementary clock signal.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus, comprising:
    a clock gating circuit (CGC), comprising:
        a clock gating device configured to selectively gate or pass a selected clock signal based on an enable signal to generate an output clock signal; and
        a clock selection circuit configured to select a non-complementary clock signal or a complementary clock signal to generate a select signal based on the output clock signal and the non-complementary clock signal or the complementary clock signal, and
        an exclusive-NOR gate including a first input configured to receive the complementary clock signal, a second input configured to receive the select signal from the clock selection circuit, and an output configured to output the selected clock signal based on the select signal.

2. The apparatus of claim 1, wherein the clock gating device is configured to pass the selected clock signal based on the enable signal being asserted.

3. The apparatus of claim 1, wherein the clock gating device is configured to generate the output clock signal at a fixed logic level based on the enable signal being deasserted.

4. The apparatus of claim 3, wherein the fixed logic level is a logic level of the output clock signal at substantially a time when the enable signal becomes deasserted.

5. The apparatus of claim 1, wherein the clock selection circuit is configured to select the non-complementary clock signal or the complementary clock in response to the enable signal becoming asserted.

6. The apparatus of claim 1, wherein the CGC further comprises a multiplexer including a first input configured to receive the non-complementary clock signal, a second input configured to receive the complementary clock signal, a select input configured to receive a select signal from the clock selection circuit, and an output configured to output the selected clock signal.

7. The apparatus of claim 1, wherein the CGC further comprises a multiplexer including a non-inverting input configured to receive the non-complementary clock signal, an inverting input configured to receive and invert the non-complementary clock signal to generate the complementary clock signal, a select input configured to receive a select signal from the clock selection circuit, and an output configured to output the selected clock signal.

8. The apparatus of claim 1, wherein the clock gating device comprises a latch including a data input configured to receive the selected clock signal, a clock input configured to receive the enable signal, and a data output configured to output the output clock signal.

9. The apparatus of claim 1, wherein the clock gating device comprises:
    a transmission gate including an input configured to receive the selected clock signal, a complementary control input configured to receive a complementary enable signal, and a non-complementary control input configured to receive a non-complementary enable signal;
    a latch inverter including an input coupled to an output of the transmission gate; and
    a latch tristate inverter including an input coupled to an output of the latch inverter, an output coupled to the input of the latch inverter, a complementary control signal configured to receive the non-complementary enable signal, and a non-complementary control signal configured to receive the complementary enable signal.

10. The apparatus of claim 9, wherein the CGC further comprises:
    a first inverter configured to generate the complementary enable signal based on the enable signal; and
    a second inverter configured to generate the non-complementary enable signal based on the complementary enable signal.

11. The apparatus of claim 9, wherein the clock gating device further comprises an output inverter coupled to an output of the latch inverter.

12. The apparatus of claim 1, wherein the clock selection circuit comprises a logic level comparator including a first input configured to receive the output clock signal, a second input configured to receive the non-complementary clock signal or the complementary clock signal, and an output configured to output a logic level difference signal, wherein the selection of the non-complementary clock signal or the complementary clock is based on the logic level difference signal.

13. The apparatus of claim 12, wherein the logic level comparator comprises an exclusive-OR gate.

14. The apparatus of claim 12, wherein the clock selection circuit further comprises a latch including a data input coupled to the output of the logic level comparator, a clock input configured to receive the enable signal, and an output configured to generate a select signal to effectuate the selection of the non-complementary clock signal or the complementary clock signal.

15. The apparatus of claim 12, wherein the clock selection circuit comprises:
   a transmission gate including an input coupled to an output of the logic level comparator, a complementary control input configured to receive a non-complementary enable signal, and a non-complementary control input configured to receive a complementary enable signal;
   a latch inverter including an input coupled to an output of the transmission gate; and
   a latch tristate inverter including an input coupled to an output of the latch inverter, an output coupled to the input of the latch inverter, a complementary control signal configured to receive the complementary enable signal, and a non-complementary control signal configured to receive the non-complementary enable signal.

16. The apparatus of claim 15, wherein the CGC further comprises:
   a first inverter configured to generate the complementary enable signal based on the enable signal; and
   a second inverter configured to generate the non-complementary enable signal based on the complementary enable signal.

17. The apparatus of claim 1, further comprising a set of one or more dual-edge-triggered flip-flops including a set of one or more clock inputs configured to receive the output clock signal.

18. An apparatus, comprising:
   a clock gating circuit (CGC), comprising:
      a multiplexer including a first input configured to receive a non-complementary clock signal and a second input configured to receive a complementary clock signal;
      a clock gating device including a first input coupled to an output of the multiplexer and a second input configured to receive an enable signal, the clock gating device comprising
         a transmission gate including an input coupled to the output of the multiplexer, a complementary control input configured to receive a complementary enable signal, and a non-complementary control input configured to receive a non-complementary enable signal,
         a latch inverter including an input coupled to an output of the transmission gate, and
         a latch tristate inverter including an input coupled to an output of the latch inverter, an output coupled to the input of the latch inverter, a complementary control signal configured to receive the non-complementary enable signal, and a non-complementary control signal configured to receive the complementary enable signal; and
      a clock selection circuit including a first input coupled to an output of the clock gating device, a second input configured to receive the non-complementary or complementary clock signal, a third input configured to receive the enable signal, and an output coupled to a select input of the multiplexer.

19. The apparatus of claim 18, wherein the clock selection circuit comprises:
   a logic level comparator including a first input coupled to the output of the clock gating device and a second input configured to receive the non-complementary or complementary clock signal; and
   a latch including a first input coupled to an output of the logic level comparator, a second input configured to receive the enable signal, and an output coupled to the select input of the multiplexer.

20. The apparatus of claim 19, wherein the logic level comparator comprises a logic gate including the first input coupled to the output of the clock gating device, a second input configured to receive the non-complementary or complementary clock signal, and the output coupled to the first input of the latch.

21. The apparatus of claim 18, wherein the multiplexer comprises an inverter including the first input configured to receive the non-complementary clock signal, a logic gate including the second input coupled to an output of the inverter, the select input coupled to the output of the clock selection circuit, and the output coupled to the clock gating device.

22. The apparatus of claim 21, wherein the logic gate comprises an exclusive-NOR gate.

* * * * *